United States Patent
Ramm et al.

(10) Patent No.: US 11,610,967 B2
(45) Date of Patent: Mar. 21, 2023

(54) VERTICAL COMPOUND SEMICONDUCTOR STRUCTURE AND METHOD FOR PRODUCING THE SAME

(71) Applicant: Fraunhofer-Gesellschaft zur Foerderung der angewandten Forschung e.V., Munich (DE)

(72) Inventors: Peter Ramm, Munich (DE); Armin Klumpp, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/936,133

(22) Filed: Jul. 22, 2020

(65) Prior Publication Data
US 2021/0036105 A1 Feb. 4, 2021

(30) Foreign Application Priority Data
Jul. 31, 2019 (DE) .......................... 102019211468.7

(51) Int. Cl.
*H01L 29/06* (2006.01)
*H01L 21/02* (2006.01)
(Continued)

(52) U.S. Cl.
CPC .... *H01L 29/0657* (2013.01); *H01L 21/02568* (2013.01); *H01L 29/24* (2013.01); *H01L 29/732* (2013.01)

(58) Field of Classification Search
CPC .......... H01L 29/0657; H01L 21/02568; H01L 29/24; H01L 29/732; H01L 23/49562;
(Continued)

(56) References Cited

U.S. PATENT DOCUMENTS

| 3,475,660 A | 10/1969 | Coblenz |
| 6,548,351 B2 | 4/2003 | Hwang |

(Continued)

FOREIGN PATENT DOCUMENTS

| EP | 1171912 B1 | 9/2003 |
| KR | 20160017027 A | 2/2016 |

(Continued)

OTHER PUBLICATIONS

Wu, C, "The Growth Mechanism of Transition Metal Dichalcogenides by using Sulfurization of Pre-deposited Transition Metals and the 2D Crystal Hetero-structure Establishment", Sci Rep 7, 42146 (2017). https://doi.org/10.1038/srep42146.
(Continued)

*Primary Examiner* — Duy T Nguyen
(74) *Attorney, Agent, or Firm* — Perkins Coie LLP; Michael A. Glenn

(57) ABSTRACT

The invention relates to a vertical compound semiconductor structure having a substrate with a first main surface and an opposite second main surface, a vertical channel opening extending completely through the substrate between the first main surface and the second main surface and a layer stack arranged within the vertical channel opening. The layer stack includes an electrically conductive layer arranged within the vertical channel opening and a compound semiconductor layer arranged within the vertical channel opening. The compound semiconductor layer includes a compound semiconductor layer arranged on the electrically conductive layer and connected galvanically to the electrically conductive layer. Further, the invention relates to a method for producing such a vertical compound semiconductor structure.

13 Claims, 6 Drawing Sheets

(51) Int. Cl.
*H01L 29/24* (2006.01)
*H01L 29/732* (2006.01)

(58) Field of Classification Search
CPC ....... H01L 23/481; H01L 24/02; H01L 24/05;
H01L 24/13; H01L 24/16; H01L
2224/02335; H01L 2224/0235; H01L
2224/0401; H01L 2224/05005; H01L
2224/05008; H01L 2224/05016; H01L
2224/05569; H01L 2224/05647; H01L
2224/13111; H01L 2224/13147; H01L
2224/16148; H01L 2224/16258; H01L
2224/16503; H01L 2224/16507; H01L
2224/81447; H01L 29/66265; H01L
29/735; H01L 29/0665; H01L 29/41708;
H01L 29/42304; H01L 29/861; H01L
29/8613; H01L 29/0684; H01L 29/66969;
H01L 29/7325; H01L 29/0804; H01L
29/0821; H01L 29/1004; H01L 29/12;
H01L 29/66272; H01L 21/76898; B82Y
40/00; B82Y 10/00
USPC ........................................................ 438/156
See application file for complete search history.

(56) References Cited

U.S. PATENT DOCUMENTS

| | | | |
|---|---|---|---|
| 6,548,391 | B1 | 4/2003 | Ramm et al. |
| 9,070,685 | B2 | 6/2015 | Takatani et al. |
| 2006/0249849 | A1 | 11/2006 | Cohen |
| 2013/0051121 | A1 | 2/2013 | Yang et al. |
| 2014/0138850 | A1 | 5/2014 | Takayama |
| 2014/0167268 | A1 | 6/2014 | Bao et al. |
| 2014/0209926 | A1 | 7/2014 | Takatani et al. |
| 2015/0060039 | A1 | 3/2015 | Lee et al. |
| 2015/0279747 | A1 | 10/2015 | Kondo et al. |
| 2015/0303299 | A1* | 10/2015 | Chang ............... H01L 21/02568 257/29 |
| 2016/0172305 | A1 | 6/2016 | Sato |
| 2016/0190299 | A1 | 6/2016 | Watanabe et al. |
| 2016/0260699 | A1 | 9/2016 | Lehnert et al. |
| 2016/0358933 | A1* | 12/2016 | Rabkin ............... H01L 29/7926 |
| 2017/0229372 | A1 | 8/2017 | Lee et al. |
| 2017/0370779 | A1 | 12/2017 | Kropelnicki et al. |
| 2019/0019946 | A1 | 1/2019 | Russell et al. |
| 2019/0157270 | A1 | 5/2019 | Matsumoto |
| 2019/0244653 | A1 | 8/2019 | Tsukamoto |
| 2020/0075498 | A1 | 3/2020 | Kume |
| 2021/0036105 | A1 | 2/2021 | Ramm et al. |

FOREIGN PATENT DOCUMENTS

| | | |
|---|---|---|
| TW | 201729379 A | 8/2017 |
| TW | 201807851 A | 3/2018 |
| TW | 201913841 A | 4/2019 |
| WO | 2019041956 A1 | 3/2019 |

OTHER PUBLICATIONS

Jiang, Junkai, et al., "Ultimate Monolithic-3D Integration With 2D Materials: Rationale, Prospects, and Challenges", IEEE Journal of the Electron Devices Society, Bd. 7, XP811742295, DOI: 18.1189/JEDS.2819.2925158, pp. 878-887.

Lee, Keon Hwa, et al., "Visible Light-Emitting Diodes With Thin-Film-Flip-Chip-Based Wafer-Level Chip-Scale Package Technology Using Anisotropic Conductive Film Bonding", IEEE Electron Device Letters, IEEE, USA, Bd. 36, No. 7, XP011585520, ISSN: 0741-3106, DOI: 10.1109/LED.2015.2434053, Jul. 1, 2015, pp. 702-704.

Taleb, F., et al., "Substrate bonding using electroplated copper through silicon vias for VCSEL fabrication", 26th International Conference on Indium Phosphide and Related Materials (IPRM), IEEE, XP032630008, DOI: 10.1109/ICI PRM.2014.6880543, pp. 1-2.

Hefner, Allen R, et al., "SiC Power Diodes Provide Breakthrough Performance for a Wide Range of Applications", IEEE Transactions on Power Electronics, Institute of Electrical and Electronics Engineers, USA, vol. 16, No. 2, Mar. 1, 2001, XP011043537, Mar. 1, 2001, 8 pp.

* cited by examiner

VERTICAL COMPOUND SEMICONDUCTOR STRUCTURE AND METHOD FOR PRODUCING THE SAME

CROSS-REFERENCE TO RELATED APPLICATIONS

This application claims priority from German Patent Application No. 102019211468.7, which was filed on Jul. 31, 2019, and is incorporated herein in its entirety by reference.

The invention relates to a vertical compound semiconductor structure having at least one vertical channel opening and a layer stack integrated therein comprising at least one compound semiconductor layer, as well as to a three-dimensional semiconductor device having such a vertical compound semiconductor structure and a method for producing such a vertical compound semiconductor structure.

BACKGROUND OF THE INVENTION

The present invention can be used particularly advantageously in the field of 3D system integration. Three-dimensional integration is the vertical connection (mechanical and electrical) of devices produced by means of planar technology. The latter are also referred to as two-dimensional or 2D systems, since the circuit structures are arranged in a horizontal two-dimensional plane (also referred to as horizontal main substrate plane). At least two two-dimensional systems produced in conventional planar technology and arranged on top of one another can then be vertically connected to form a 3D system. Here, the vertical direction relates to the above-stated horizontal two-dimensional plane of the respective 2D system or to the device structures extending in a planar (horizontal) manner across the respective substrate, such as integrated circuits or doped regions, wherein the vertical direction essentially runs perpendicular to the horizontal plane. Accordingly, a 3D system (vertical and horizontal) can comprise at least two or more 2D systems (horizontal) arranged vertically on top of one another.

The 3D systems are mainly divided into two main groups. In so-called 3D packaging, two or more individual assemblies, such as chips or dies are stacked vertically on top of one another and are integrated in a three-dimensionally arranged package. The individual assemblies are connected to one another by means of vertical vias. Here, the circuits of the individual chips are not integrated in a single common circuit. The same still communicate outside the chip via electrical signals, as if they were mounted in different housings on a printed circuit board. In the so-called ICs (IC=integrated circuit), however, several components of a common circuit are arranged vertically on top of one another and are connected to a single common circuit by means of vertical vias. This means a 3D IC acts like a single IC. All components on all chip levels communicate with one another within the 3D IC, depending on how the same was designed, both vertically as well as horizontally.

If, for the purpose of the present disclosure, a three-dimensional system integration, a 3D system or a three-dimensional semiconductor device and the same is discussed, this includes both of the above-stated main groups.

The advantages of a three-dimensional integrated microelectronic system are, among others, the higher packing densities and switching velocities that can be obtained with the same design rules compared two-dimensional systems produced conventionally in planar technology. These higher switching velocities are, on the one hand, due to shorter conduction paths between the individual devices or circuits and, on the other hand, due to the option of parallel information processing.

When realizing a connecting technology with highly integrable vertical contacts through the substrate at freely selectable locations (in the case of silicon: TSV—through silicon via), the performance increase of the system is at an optimum.

Conventional technology in 3D integration with freely selectable through silicon vias, the so-called 3D IC technology (Handbook of 3D Integration, Volume 1), is described, among others, by patent EP 1 171 912 B1 (Method for Vertical Integration of Electronic Devices by Means of Back Contacting).

In 3D IC integration, through silicon vias are produced in the respective devices during processing. It is a promising approach to produce the TSV after completing the so-called front end of line processes but before the so-called back end of line (BEOL) processes. It is a disadvantage that this concept as well as other similar concepts involve compatibility of the TSV processes with the semiconductor production processes.

According to conventional technology, vertical integration is realized in different substrates or substrate planes between planar device structures. In lateral direction, this results in high integration density within minimum space. Apart from the lateral dimensions of the substrate vias, the lateral extension of the device structures and their wiring, however, basically limits the obtainable integration density of the three-dimensional integrated devices.

SUMMARY

According to an embodiment, a vertical compound semiconductor structure may have: a substrate with a first main surface and an opposite second main surface, a vertical channel opening extending completely through the substrate between the first main surface and the second main surface, a layer stack arranged within the vertical channel opening, wherein the layer stack includes an electrically conductive layer arranged within the vertical channel opening and a compound semiconductor layer arranged within the vertical channel opening, wherein the compound semiconductor layer includes a compound semiconductor arranged on the electrically conductive layer and connected galvanically to the electrically conductive layer.

Another embodiment may have a three-dimensional electronic semiconductor device including at least one inventive vertical compound semiconductor structure, wherein an additional separate electronic device structure is arranged opposite to the first and/or second main surface of the substrate, which is connected mechanically and/or galvanically to the vertical compound semiconductor structure by means of a contacting portion.

According to another embodiment, a method for producing a vertical compound semiconductor structure may have the steps of: providing a substrate with a first main surface and an opposite second main surface, structuring a vertical channel opening extending completely through the substrate between the first main surface and the second main surface, generating a layer stack within the vertical channel opening, the step of generating the layer stack having the steps of: arranging an electrically conductive layer within the vertical channel opening and arranging a compound semiconductor layer within the vertical channel opening, wherein the compound semiconductor layer is arranged on the electrically conductive layer and galvanically connected to the electrically conductive layer.

The inventive vertical compound semiconductor structure comprises a substrate having a first main surface and an opposite second main surface. The substrate can comprise, for example, silicon, glass or quartz. A vertical channel opening extending completely through the substrate between the first main surface and the second main surface is provided in the substrate. A vertical layer stack is arranged within this vertical channel opening. The layer stack extends vertically within the vertical channel opening. The layer stack comprises an electrically conductive layer arranged within the vertical channel opening and along the extension direction of the vertical channel opening and a compound semiconductor layer arranged within the vertical channel opening and along the extension direction of the vertical channel opening. The compound semiconductor layer comprises a compound semiconductor arranged on the electrically conductive layer and connected galvanically to the electrically conductive layer. Thereby, the integration density can be increased advantageously and significantly compared to conventional systems. In conventional 3D systems, at least two two-dimensional systems with planar device structures arranged thereon are stacked on top of each other and connected to one another by means of vertical vias. Here, the vertical vias serve exclusively for the mutual galvanic and possibly mechanical connection of the planar device structures of the two-dimensional systems. In the inventive apparatus, however, the space available in the vertical vias is used additionally and most effectively to integrate one or several inventive vertical device structures therein, as an alternative or in addition to the conventional planar device structures. Here, it is particularly advantageous that semiconductor device structures having at least one compound semiconductor can be integrated in the vertical vias (channel openings). Here, the above-mentioned vertical layer stack is generated in the channel opening where a vertical via can be generated. The layer stack comprises an electrically conductive layer that can be contacted from outside. This can be a metallization layer. Further, the layer stack comprises a compound semiconductor layer comprising a compound semiconductor arranged directly and immediately on the electrically conductive layer and connected galvanically to the electrically conductive layer. In conventional technology, such semiconductor device structures are mainly produced in silicon technology, i.e., no compound semiconductors but elemental semiconductors are used. In the case of silicon, currently, at most polycrystalline silicon can be deposited on the metallization layer, since for generating monocrystalline silicon, heating above the melting temperature of silicon would have to take place during process control, which would lead, however, to the destruction of the underlying layers, such as the metallization layer. In the inventive generation of the layer stack with a compound semiconductor, however, the electrically conductive layer, e.g., metallization layer, remains intact. The electrically conductive layer can be contacted from outside and the electrically conductive layer can hence emit the charge carriers across its entire surface to the compound semiconductor layer, such that the same is fully contacted. With this inventive layer stack, a vertical compound semiconductor layer structure can be generated that is arranged or integrated within the vertical channel opening of a via and can still be contacted fully. Due to these circumstances, the integration density of 3D systems can be significantly increased since the same can now not only comprise device structures arranged in planar planes but also vertically integrated device structures.

According to an embodiment, the compound semiconductor layer can comprise a monocrystalline compound semiconductor. Compared to polycrystalline structures, monocrystalline compound semiconductors have particularly good electrical characteristics. Therefore, in the conventional silicon-based methods, the usage of monocrystalline silicon is advantageous. However, as mentioned above, due to the available processes, at most polycrystalline silicon can be deposited directly on an electrically conductive layer and in particular on a metallization layer. The invention described herein allows to dispose monocrystalline compound semiconductor material directly on the electrically conductive layer. Single crystals of more or less complex chemical compounds are also part of monocrystalline compound semiconductor material.

According to a further embodiment, the compound semiconductor layer can comprise at least one 2D composite material. The 2D composite material is not to be mixed up with the 2D systems also described herein. 2D materials, sometimes also referred to as single layer or monolayer materials, are crystalline materials merely comprising a single atomic layer. Several of these monolayers can be stacked on top of each other. 2D materials have the characteristic that the same are deposited or implemented in a monocrystalline manner. Due to unusual characteristics, the same are the subject of extensive (fundamental) research. Generally, 2D materials can either be considered as two-dimensional allotropes of different elements or as compounds of different elements with covalent bond, so-called 2D composite materials. A known representative of an allotropic 2D material is, for example, graphene. As non-limiting and non-exhaustive examples for 2D composite materials, graphene, boronitrene, germanium phosphide and molybdenum (IV) sulfide can be stated. In the following, in particular the compounds of different elements, i.e., 2D composite materials and here in particular compound semiconductors will be considered. The efficient integration of 2D materials in 3D systems is still an extreme challenge as well as a limiting factor in the overall performance of the system and in the circuit design.

According to a further embodiment, the compound semiconductor layer can comprise at least one material of the group of the transition metal dichalcogenides. Transition metal dichalcogenides are also referred to as TMDs. TMDs are normally structured of three atomic planes and mostly include two different atomic species, namely one metal and two chalcogenides. The transition metal dichalcogenides, also referred to as TMD monolayers are atomic thin semiconductors of type MX2, wherein M refers to a transition metal atom (e.g., Mo, W, etc.) and X refers to a chalcogenide atom (e.g., S, Se or Te). Here, normally, one layer of M atoms is arranged between two layers of X atoms. These arrangements are part of the superordinate group of 2D materials. TMD monolayers, such as $MoS_2$, $WS_2$, $MoSe_2$, $WSe_2$, $MoTe_2$ have a direct band gap which characterizes them for the usage as compound semiconductors in the inventive compound semiconductor layer.

According to a further embodiment, the compound semiconductor layer can comprise molybdenum disulfide $MoS_2$. Due to its electrical characteristics, molybdenum disulfide is particularly well suited as compound semiconductor in the inventive compound semiconductor layer. Additionally, an $MoS_2$ monolayer has a thickness of just 6.5 Å, which is why the same is particularly well suited to be integrated into the vertical channel opening.

According to a further embodiment, the compound semiconductor layer can be arranged on the electrically conductive layer by means of deposition. Here, the compound semiconductor layer can be deposited directly on the electrically conductive layer, e.g., metallization layer. Depositing the compound semiconductor material presents a simple and relatively cost-effective option for arranging the compound semiconductor layer on the electrically conductive layer.

According to an alternative embodiment, the compound semiconductor layer can be formed of at least part of the electrically conductive layer by means of chemical conversion. Alternatively or additionally, the compound semiconductor layer can be formed of at least part of a further layer (e.g., metallization layer) deposited on the electrically conductive layer by means of chemical conversion. Chemical conversion means a novel method differing from the above-mentioned deposition methods. In chemical conversion, parts of an output layer are converted into the compound semiconductor layer by chemical reactions. The electrically conductive layer or a further layer can be used as an output layer. The output layer is a metallization layer and in particular a transition metal, such as molybdenum. The same can be converted by means of suitable reaction partners, such as sulfur. In this chemical conversion, a compound semiconductor layer results from a 2D material comprising a TMD monolayer, in this case $MoS_2$.

According to a further embodiment, the layer stack can comprise a second compound semiconductor layer arranged within the vertical channel opening and along the extension direction of the vertical channel opening, which is arranged on the compound semiconductor layer and connected galvanically to the same. Here, the second compound semiconductor layer is arranged on the side of the compound semiconductor layer opposite to the electrically conductive layer, such that the compound semiconductor layer is arranged between the electrically conductive layer and second compound semiconductor layer. By means of this arrangement, for example, a diode structure can be generated within the vertical channel opening.

According to a further embodiment, the second compound semiconductor layer can comprise at least one 2D composite material. Accordingly, like the above mentioned (first) compound semiconductor layer, the second compound semiconductor layer can comprise, for example, at least one material of the group of transition metal dichalcogenides, and in particular $MOS_2$.

According to further embodiments, the layer stack can comprise a third compound semiconductor layer arranged within the vertical channel opening (and along the extension direction of the vertical channel opening), which is arranged on the second compound semiconductor layer and connected galvanically to the same. Here, the third compound semiconductor layer is arranged on the side of the second compound semiconductor layer opposite to the compound semiconductor layer, such that the second compound semiconductor layer is arranged between the compound semiconductor layer and the third compound semiconductor layer. By means of this arrangement, for example, a transistor structure can be generated within the vertical channel opening.

According to a further embodiment, the third compound semiconductor layer can at least comprise a 2D composite material. Accordingly, like the above mentioned (first) compound semiconductor layer and/or the second compound semiconductor layer, the third compound semiconductor layer can comprise, for example, at least one material of the group of transition metal dichalcogenides and in particular $MOS_2$.

According to a further embodiment, the layer stack can comprise a second electrically conductive layer arranged within the vertical channel opening and along the extension direction of the vertical channel opening, which is arranged on the third compound semiconductor layer and connected galvanically to the same. Here, the second electrically conductive layer is arranged on the side of the third compound semiconductor layer opposite to the second compound semiconductor layer, such that the third compound semiconductor layer is arranged between the second compound semiconductor layer and the second electrically conductive layer. This second electrically conductive layer can be contacted from outside and the second electrically conductive layer can hence emit the charge carriers across its entire surface to the third compound semiconductor layer, such that the same is fully contacted.

A three-dimensional electronic semiconductor device (3D system) can be produced with the vertical compound semiconductor structure, in that an additional separate electronic device structure is arranged opposite to the first and/or second main surface of the substrate, which is connected mechanically and/or galvanically to the vertical compound semiconductor structure and in particular to the compound semiconductor layer by means of a contacting portion. The additional separate electronic device structure can, for example, be a two-dimensional system produced in planar technology or a further inventive vertical compound semiconductor structure. The 3D system produced in that way can be a 3D package or 3D IC.

Further, the invention relates to a method for producing a respective vertical compound semiconductor structure. The method includes providing a substrate having a first main surface and an opposite second main surface as well as structuring a vertical channel opening extending completely through the substrate between the first main surface and the second main surface. According to the invention, a layer stack is generated within the vertical channel opening. The step of generating the layer stack includes arranging a electrically conductive layer within the vertical channel opening and along the extension direction of the vertical channel opening, as well as arranging a compound semiconductor layer comprising at least one compound semiconductor within the vertical channel opening and along the extension direction of the vertical channel opening. Here, the compound semiconductor layer is arranged on the electrically conductive layer and connected galvanically to the electrically conductive layer. Regarding the advantages of the method, reference is made to the above statements concerning the respective apparatus.

BRIEF DESCRIPTION OF THE DRAWINGS

Embodiments of the present invention will be detailed subsequently referring to the appended drawings, in which.

DETAILED DESCRIPTION OF THE INVENTION

In the following, embodiments will be described in more detail with reference to the figures, wherein elements having the same or similar functions are provided with the same reference numbers.

Method steps illustrated in a block diagram and discussed with reference to the same can also be performed in any other as in the shown or described order. Additionally, method steps relating to a specific feature of an apparatus can be interexchanged with exactly this feature of the apparatus, which also applies vice versa.

Figure 1:
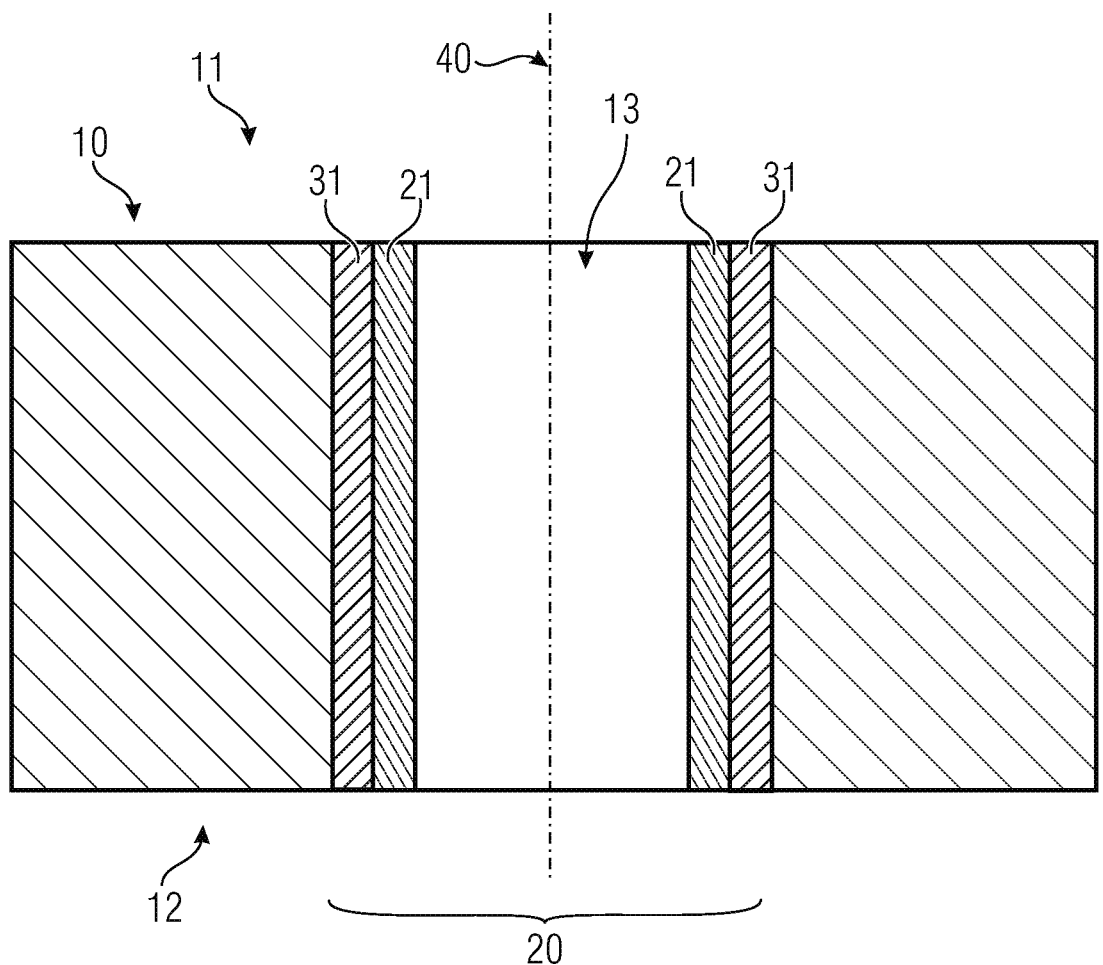
FIG. 1 is a schematic lateral sectional view of a vertical compound semiconductor structure according to an embodiment.

FIG. 1 shows a schematic lateral sectional view of an inventive vertical compound semiconductor structure 100. The same comprises a substrate 10 having a main surface 11 and an opposite second main surface 12.

A vertical channel opening 13 extends completely through the substrate 10 between the first main surface 11 and the second main surface 12. A layer stack 20 is arranged within the vertical channel opening 13.

The layer stack 20 comprises an electrically conductive layer 31. The electrically conductive layer 31 can be, for example, a metallization layer and in particular a layer comprising a transition metal. The electrically conductive layer 31 is arranged within the vertical channel opening 13. For example, the electrically conductive layer 31 can be arranged, e.g. deposited, on a lateral circumferential wall of the vertical channel opening 13. The electrically conductive layer 31 can be arranged directly and immediately on the wall of the vertical opening 13, for example when the substrate 10 is not electrically conductive. Optionally, an isolator layer 33 (FIG. 3A), e.g., a dielectric, can be provided between the electrically conductive layer 31 and the wall of the vertical channel opening 13, for example when the substrate 10 has electrically conductive characteristics. The electrically conductive layer 31 can extend along the extension direction of the vertical channel opening 13. Additionally, the electrically conductive layer 31 can be arranged partly or, as shown, completely within the vertical channel opening 13.

Additionally, the layer stack 20 comprises a compound semiconductor layer 21. The compound semiconductor layer 21 is arranged within the vertical channel opening 13. The compound semiconductor layer 21 can extend along the extension direction of the vertical channel opening 13. The compound semiconductor layer 21 can be arranged partly or, as shown, completely within the vertical channel opening 13. The compound semiconductor layer 21 can be arranged directly and immediately on the electrically conductive layer 31. In radial direction, the compound semiconductor layer 21 can be arranged closer to a center 40 of the vertical channel opening 13 than the electrically conductive layer 31. This means the compound semiconductor layer 21 can be arranged further to the inside within the vertical channel opening 13 than the electrically conductive layer 31. However, it would also be possible that this arrangement is vice versa, this means the electrically conductive layer 31 would be arranged further to the inside than the compound semiconductor layer 21.

The compound semiconductor layer 21 and the electrically conductive layer 31 can have the same layer thickness. However, different layer thicknesses are possible. For example, the compound semiconductor layer can have a lower layer thickness than the electrically conductive layer 31. This can, among others, be due to the fact that the electrically conductive layer 31 serves to contact the compound semiconductor layer 21 to a large extent and advantageously fully. On the other hand, the compound semiconductor layer 21 can be configured as monocrystalline 2D material, which merely comprises one or several (e.g., two to five) individual atomic layers and is hence extremely thin.

According to the invention, the compound semiconductor layer 21 comprises a compound semiconductor arranged on the electrically conductive layer 31 and connected galvanically to the electrically conductive layer 31. By definition, the compound semiconductor layer is to be distinguished from an elemental semiconductor. While the elemental semiconductor is made up of a single element, e.g., silicon, compound semiconductors are made up of several elements.

Above that, it is advantageous when the compound semiconductor is monocrystalline. However, for example, the elemental semiconductor silicon cannot be deposited in a monocrystalline manner on the electrically conductive layer, since for this the deposition temperature during processing would have to be increased above or beyond the melting temperature of silicon which would, in practice, result in damages of the surrounding members and components.

Therefore, according to an embodiment, the compound semiconductor layer 21 can comprise a so-called 2D material. For a more accurate definition of the 2D material, reference is made to the paragraphs in the above general description part. The 2D material has the characteristic and hence the advantage that the same can be arranged in a monocrystalline manner on the electrically conductive layer 31. Here, the 2D material forms layers that consist, at the molecular level, of individual atomic layers, the so-called monolayers. The 2D material can comprise a single atomic layer or several atomic layers can be combined to a common 2D composite material.

Advantageously, the compound semiconductor layer 21 can comprise at least one material of the group of transition metal dichalcogenides. The compound semiconductor layer 21 can comprise, for example, a 2D composite material with at least one material of the group of transition metal dichalcogenides. Transition metal dichalcogenides are atomic thin semiconductors of type $MX_2$, wherein M refers to a transition metal atom (e.g., Mo, W, etc.) and X refers to a chalcogenide atom (e.g., S, Se or Te). Here, normally, one layer of M atoms is arranged between two layers of X atoms. Part of these are, for example, $MoS_2$, $WS_2$, $MoSe_2$, $WSe_2$, $MoTe_2$ that are well suited for usage in the compound semiconductor layer 21.

Figure 2:
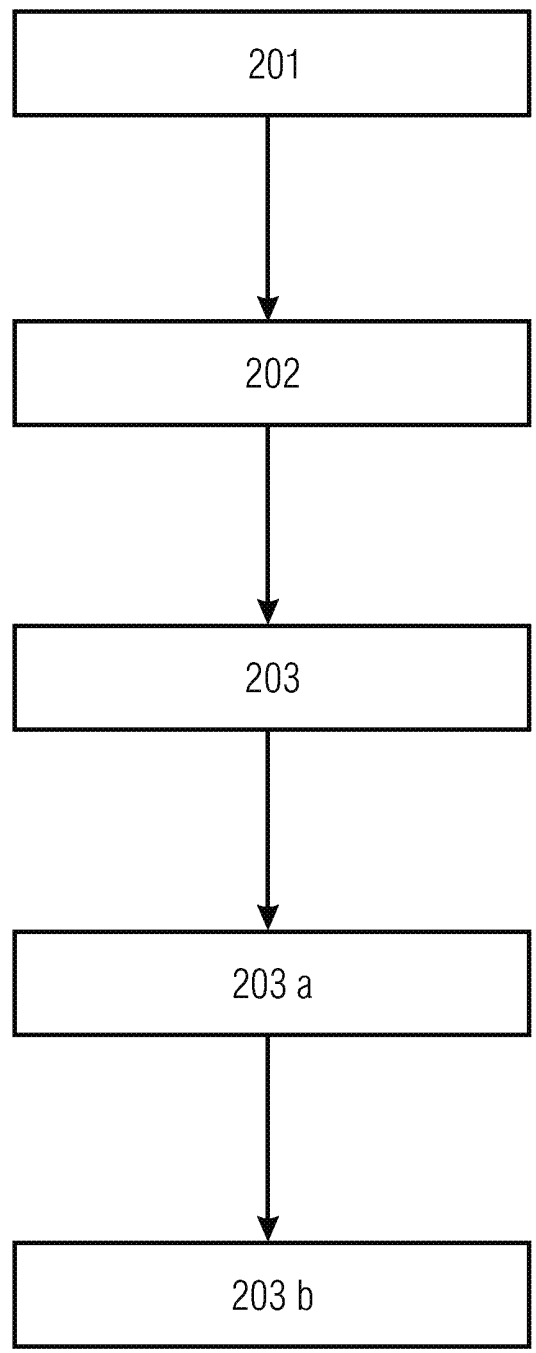
FIG. 2 is a schematic block diagram for illustrating individual method steps of a method for producing a vertical compound semiconductor structure according to an embodiment.

FIG. 2 shows a block diagram of an inventive method for producing a vertical compound semiconductor structure 100 described herein.

In block 201, a substrate 10 having a first main surface 11 and an opposite second main surface 12 is provided.

In block 202, a vertical channel opening 13 that extends completely through the substrate 10 between the main surface 11 and the second main surface 12 is structured into the substrate 10.

In block 203, a layer stack 20 is generated within the vertical channel opening 13.

In block 203a, for generating the layer stack 20, an electrically conductive layer 31 is arranged within the vertical channel opening 13 in a first step.

In block 203b, for generating the layer stack 20, a compound semiconductor layer 21 comprising at least one compound semiconductor is arranged within the vertical channel opening 13 in a second step, wherein the compound semiconductor layer 21 is arranged on the electrically conductive layer 31 and connected galvanically to the electrically conductive layer 31. The compound semiconductor layer 21 can be arranged directly or immediately on the electrically conductive layer 31.

When steps 203a and 203b are performed in the stated order, this results in a layer stack 20 where the electrically conductive layer 31 is arranged between the compound semiconductor layer 21 and the substrate 10. Optionally, an isolator layer 33 (FIG. 3A) can additionally be arranged between the substrate 10 and the electrically conductive layer 31.

Steps 203a and 203b can also be performed the other way round. In that case, a layer stack 20 would result, wherein the compound semiconductor layer 21 is arranged between the electrically conductive layer 31 and the substrate 10. Optionally, additionally, an isolator layer 33 (FIG. 3A) can be arranged between the substrate 10 and the compound semiconductor layer 21.

Generally, it applies that all method steps described herein can also be performed in another order than the one stated.

Inventively, the compound semiconductor layer 21 can be arranged in two different ways on the electrically conductive layer 31. In a first embodiment, the compound semiconductor layer 21 can be deposited on the electrically conductive layer 31. The temperatures for depositing of, for example, monocrystalline 2D materials can be significantly lower than the temperatures for depositing monocrystalline silicon. Thereby, process compatibility can be ensured.

In a second embodiment, the compound semiconductor layer 21 can be formed by means of chemical conversion. For this, part of the electrically conductive layer 31 can be transformed or converted into a compound semiconductor layer 21 by means of suitable reaction partners. The electrically conductive layer 31 can comprise, for example, a material of the group of the transition metals, such as molybdenum. A suitable reaction partner for conversion would, for example, be sulfur. Sulfur combines with molybdenum to molybdenum(IV) disulfide $MoS_2$, which is present directly as monocrystalline 2D composite material or monolayer after conversion.

Alternatively, instead of converting part of the electrically conductive layer 31, a suitable material, such as a metal, can be arranged on the electrically conductive layer 31. Here, again, a material of the group of transition metals can be arranged on the electrically conductive layer 31. With a suitable reaction partner, e.g., sulfur, this additional material layer can be transformed or converted into the compound semiconductor layer 21.

The advantage of chemical conversion compared to deposition is that the respective layer thicknesses of the electrically conductive layer 31 and the compound semiconductor layer 21 can be much lower in chemical conversion than in deposition. During deposition, the compound semiconductor layer 21 is deposited on the electrically conductive layer 31 as additional material, i.e., the overall layer thickness of the layer stack 20 is combined of the layer thickness of the electrically conductive layer 31 plus the layer thickness of the compound semiconductor layer 21 arranged thereon. In chemical conversion, however, the electrically conductive layer 31 is at least partly transformed or converted into the compound semiconductor layer 21. Here, the overall layer thickness of the layer stack 21 is therefore merely combined of the layer thickness of the original electrically conductive layer 31.

Figure 3A:
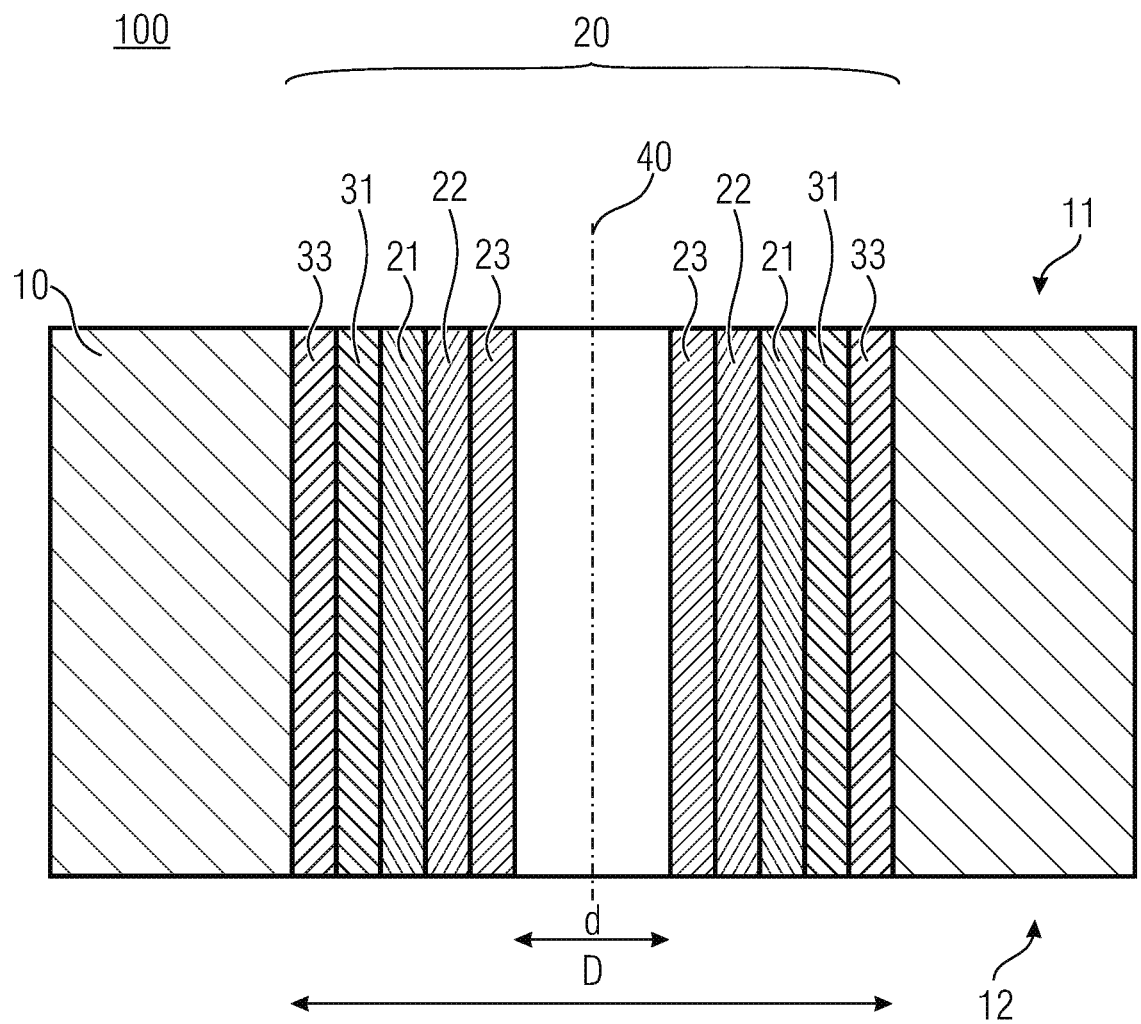
FIG. 3A is a schematic lateral sectional view of a vertical compound semiconductor structure according to an embodiment.
Figure 3B:
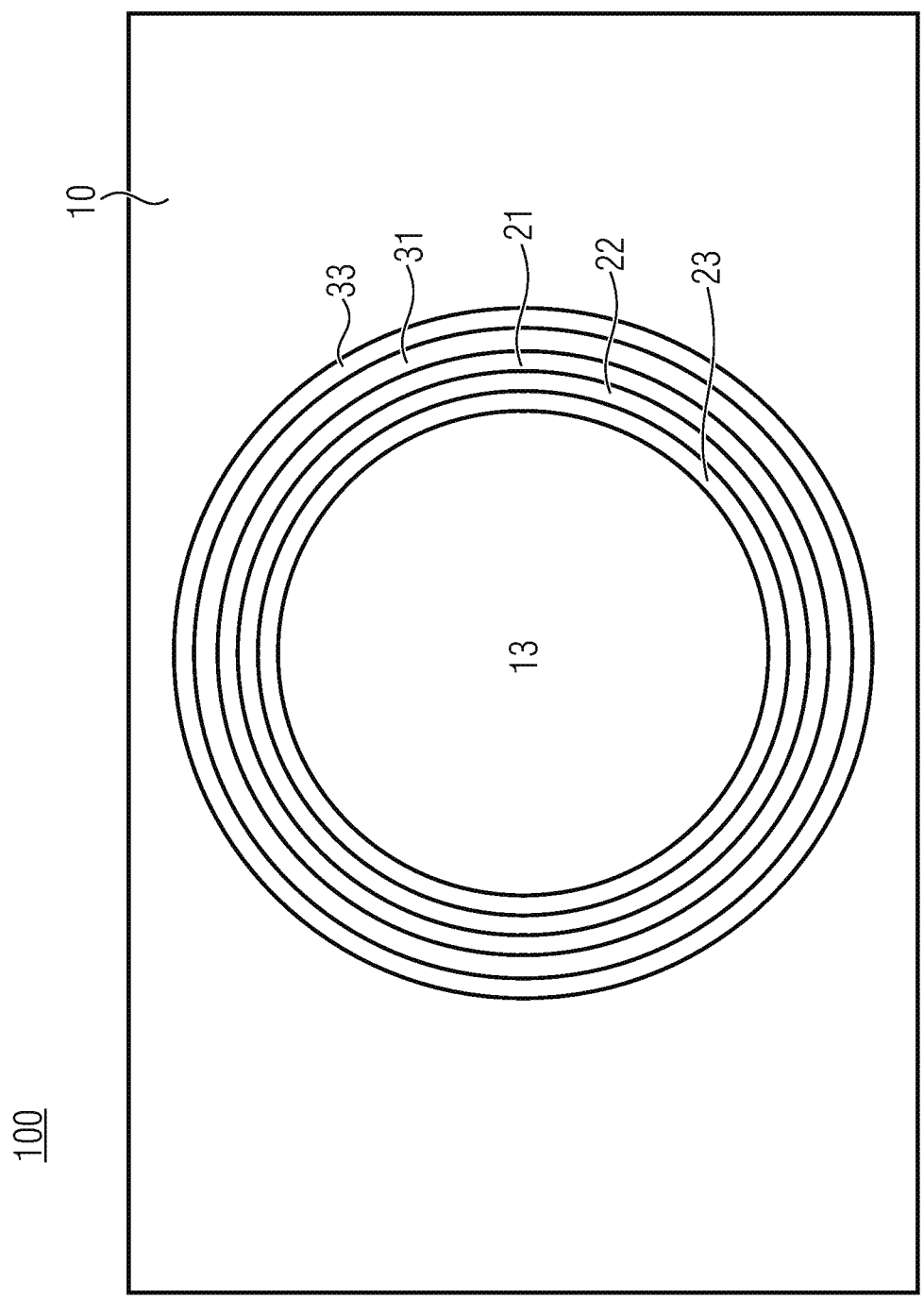
FIG. 3B is a top view of the vertical compound semiconductor structure of FIG. 3A.

FIGS. 3A and 3B show a further embodiment of a vertical compound semiconductor structure 100. The vertical compound semiconductor structure 100 shown herein comprises a layer stack 20 having several layers. FIG. 3A shows a lateral sectional view and FIG. 3B shows a top view.

In this embodiment, the layer stack 20 comprises an electrically conductive layer 31. The electrically conductive layer 31 can be arranged directly and immediately on the substrate 10, for example when the substrate 10 has non-conducting characteristics. Optionally, an isolator layer 33 (dielectric) can be arranged between the substrate 10 and the electrically conductive layer 31, e.g., when the substrate 10 has conducting characteristics.

Further, the substrate stack 20 can comprise a second compound semiconductor layer 22 arranged within the vertical channel opening 13 and along the extension direction 22 of the vertical channel opening 13. The second compound semiconductor layer 22 can be arranged on the above-described compound semiconductor layer 21, which can also be referred to as a first compound semiconductor layer 21 in a layer stack 20 having several layers, and can be connected galvanically to the same.

Here, the second compound semiconductor layer 22 can be arranged on the side of the first compound semiconductor layer 21 opposite to the electrically conductive layer 31, such that the first compound semiconductor layer 21 is arranged between the electrically conductive layer 31 and the second compound semiconductor layer 22. Accordingly, the first compound semiconductor layer 21 can be arranged radially further to the outside within the vertical channel opening 13 than the second compound semiconductor layer 22. Also, the electrically conductive layer 31 can be arranged radially further to the outside within the vertical channel opening 13 than the first compound semiconductor layer 21 as well as the second compound semiconductor layer 22. The second compound semiconductor layer 22 can be arranged directly or immediately on the first compound semiconductor layer 21.

The second compound semiconductor layer 22 can also comprise one of the materials described above with reference to the first compound semiconductor layer 21, e.g., a 2D composite material and in particular a material of the group of transition metal dichalcogenides, such as $MOS_2$. As described above with reference to the first compound semiconductor layer 21, the second compound semiconductor layer 22 can also be arranged on the first compound semiconductor layer 21 by means of deposition or by means of chemical conversion. For chemical conversion, for example, a suitable additional material, such as a metal or a transition metal, can be pre-deposited on the first compound semiconductor layer 21 which can then be transformed or converted into the second compound semiconductor layer 22 by means of chemical conversion.

In FIGS. 3A and 3B, further layers are shown. As long as the layer stack 20 comprises at least the first compound semiconductor layer 21 and the second compound semiconductor layer 22, the inventive vertical compound semiconductor structure 100 can be realized as a diode structure arranged within the vertical channel opening 13.

Further, the substrate stack 20 can comprise a third compound semiconductor layer 23 arranged within the vertical channel opening 13 and along the extension direction of the vertical channel opening 13. The third compound semiconductor layer 23 can be arranged on the above-described second compound semiconductor layer 22 and can be connected galvanically to the same.

Here, the third compound semiconductor layer 23 can be arranged on the side of the second compound semiconductor layer 22 opposite to the first compound semiconductor layer 21, such that the second compound semiconductor layer 22 is arranged between the first compound semiconductor layer 21 and the third compound semiconductor layer 23. Accordingly, the second compound semiconductor layer 22 can be arranged radially further to the outside within the vertical channel opening 13 than the third compound semiconductor layer 23. Also, the first compound semiconductor layer 21 can be arranged radially further to the outside in the vertical channel opening 13 than the second compound semiconductor layer 22 as well as the third compound semiconductor layer 23. The third compound semiconductor layer 23 can be arranged directly or immediately on the second compound semiconductor layer 22.

The third compound semiconductor layer 23 can also comprise one of the materials described above with respect to the first compound semiconductor layer 21, e.g., a 2D composite material and in particular a material of the group of transition metal dichalcogenides, such as $MOS_2$. As descried above with reference to the first compound semiconductor layer 21, the third compound semiconductor layer 23 can also be arranged on the second compound semiconductor layer 22 by means of the deposition or by means of chemical conversion. For chemical conversion, for example, a suitable additional material, such as metal or transition metal can be pre-deposited on the second compound semiconductor layer 22, which can then be transformed or converted into the third compound semiconductor layer 23 by means of chemical conversion.

As long as the layer stack 20 comprises the compound semiconductor layers shown in FIGS. 3A and 3B, i.e., the first compound semiconductor layer 21, the second compound semiconductor layer 22 as well as the third compound semiconductor layer 23, the inventive vertical compound semiconductor layer structure 100 can be realized as a transistor structure arranged within the vertical channel opening 13. More accurately, this is a vertical dipolar transistor.

As can be seen in FIGS. 3A and 3B, the electrically conductive layer 31 and the first compound semiconductor layer 21 arranged thereon can extend along the extension direction of the essentially cylinder-shaped channel opening 13. This applies accordingly to all layers arranged within the vertical channel opening 13, such as for the above-described second and third compound semiconductor layers 22, 23.

One or several of the layers 21, 22, 23, 31, 32 or the entire layer stack 20 arranged within the vertical channel opening 13 can extend completely between the first main surface 11 of the substrate 10 and the second main surface 12 of the substrate 10 in vertical direction. It is also possible that one or several layers of the layer stack 20 extend only partly between the first main surface 11 of the substrate 10 and the second main surface 12 of the substrate 10 in vertical direction.

Each of the layers 21, 22, 23, 31, 32 arranged within the vertical channel opening 13 can be configured in the form of a hollow cylinder. Thus, the layer stack 20 comprises several layers 21, 22, 23, 31, 32 configured in a hollow cylinder shape that can be stacked within one another in radial direction, as can be seen in the top view shown in FIG. 3B.

At least the outermost layer of the layer stack 20 in radial direction (in this example the isolator layer 33) can be arranged directly and immediately on the lateral circumferential wall of the cylinder-shaped vertical channel opening 13. The further layers can then follow one after the other in radial direction to the inside towards a center 40 of the channel opening 13.

This means the layer stack 20 can comprise an electrically conductive layer 31 configured in a hollow cylinder shape as a first layer. As a second layer, the layer stack 20 can comprise a first compound semiconductor layer 21 configured in a hollow cylinder shape arranged within the electrically conductive layer 31 configured in a hollow cylinder shape in radial direction. As a third layer, the layer stack 20 can comprise a second compound semiconductor layer 22 configured in a hollow cylinder shape arranged within the first compound semiconductor layer 21 configured in a hollow cylinder shape in radial direction. As a fourth layer, the layer stack 20 can comprise a third compound semiconductor layer 23 configured in a hollow cylinder shape arranged within the second compound semiconductor layer 22 configured in a hollow cylinder shape in radial direction.

It is also possible that further layers, for example metallization layers, are arranged between the individual layers 21, 22, 23, 31, 33.

Thus, the entire layer stack 20 can be configured in the form of a hollow cylinder comprising one or several layers, such that the original diameter D (FIG. 3A) of the channel opening 13 is reduced by the layer thickness (to be measured in radial direction) of the layer stack 20. The reduced diameter of the channel opening 13 including the layer stack 20 is indicated by reference number d.

Therefore, the layer stack 20 can be referred to as vertical layer stack. The same comprises several layers that can be stacked inside one another in radial direction. Here, the entire layer stack 20 extends in an axial direction with respect to the vertical channel opening 13, i.e., in an extension direction of the vertical channel opening 13.

As mentioned above, the inventive vertical compound semiconductor structure 100 can be realized as a diode structure or transistor structure arranged within the vertical channel opening 13.

Figure 4:
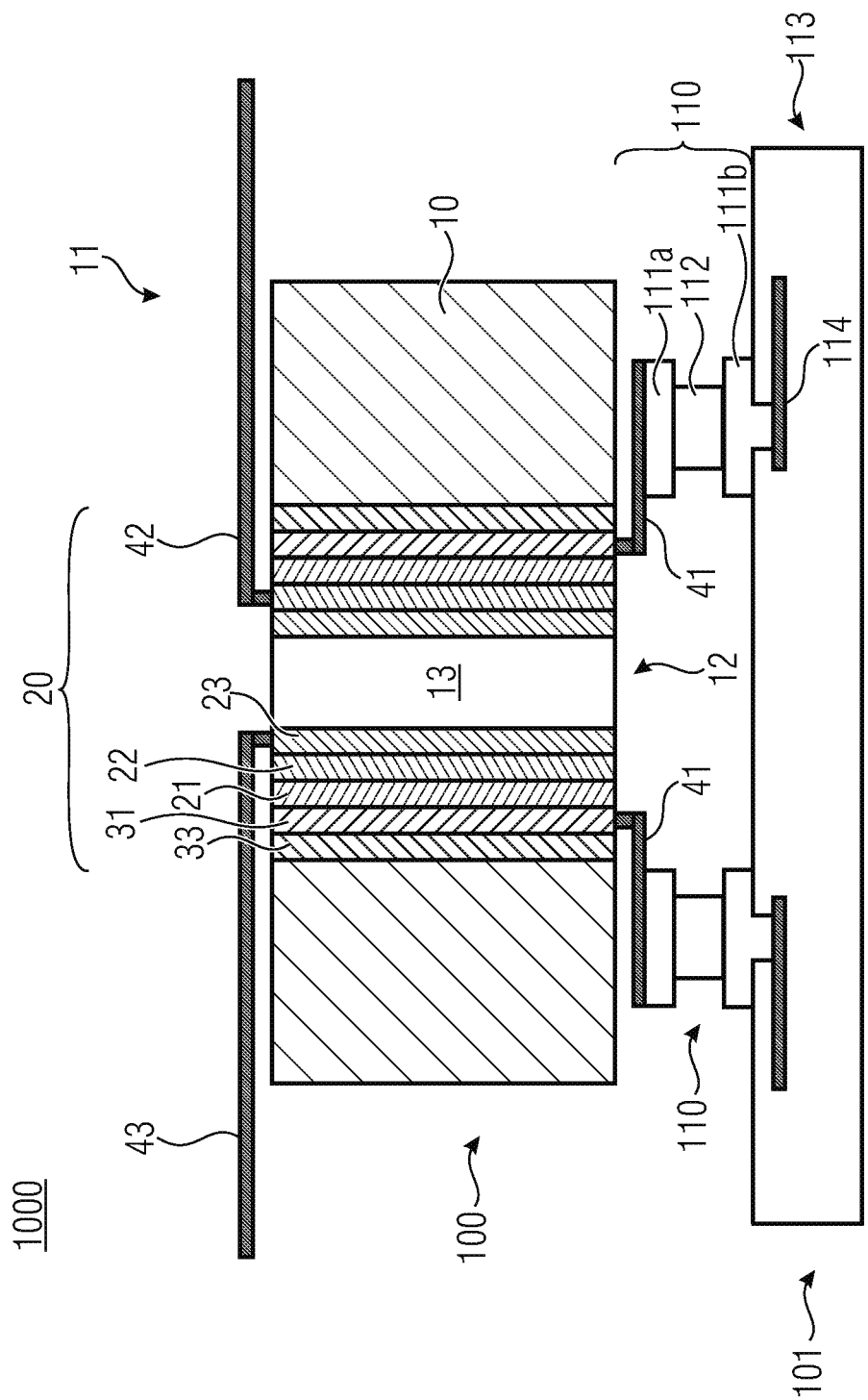
FIG. 4 is a schematic lateral sectional view of a vertical compound semiconductor structure with connection structure (wiring and control) to a separate electronic device structure for producing a three-dimensional electronic semiconductor element according to an embodiment.

FIG. 4 shows an embodiment of an inventive vertical compound semiconductor structure 100 configured as a transistor. This can be a vertical bipolar transistor. This embodiment corresponds essentially to the embodiment discussed above with reference to FIGS. 3A and 3B, which is why only the differences will be discussed in the following.

The first, second and third compound semiconductor layers 21, 22, 23 can each be contacted separately. In the embodiment shown in FIG. 4, the second compound semiconductor layer 22 and the third compound semiconductor layer 23 can be contacted directly, for example by means of directly connected electrical conductors 42, 43 or leads.

The first compound semiconductor layer 21 can, for example, be contacted indirectly, for example via the electrically conductive layer 31. In that case, the first compound semiconductor layer 21 can be configured in a contactless manner, i.e., the same has no direct contact or connection. The electrically conductive layer 31, however, can be directly contacted, for example by means of a directly connected electrical conductor 41. Thus, the electrically conductive layer 31 is contacted and emits its charge carriers across a large surface, advantageously fully, to the first compound semiconductor layer 21. Therefore, the electrically conductive layer 31 can also be referred to as connection layer for connecting the contactless compound semiconductor layer 21.

The three compound semiconductor layers 21, 22, 23 arranged within one another can form three alternating pn junctions to realize the transistor structure. Depending on the connection type, for example, the first compound semiconductor layer 21 can provide an emitter layer of the vertical bipolar transistor 100. The second compound semiconductor layer 22 can provide a base layer of the vertical bipolar transistor 100. The third compound semiconductor layer 23 can provide a collector layer of the vertical bipolar transistor 100. The emitter layer and the collector layer can also be interexchanged. Normally, the emitter layer will have a higher charge carrier density than the base layer and the base layer will again have a higher charge carrier density than the collector layer.

In FIG. 4, the inventive vertical compound semiconductor structure 100 configured as a transistor structure is illustrated as part of a 3D system 1000. For this, the inventive vertical compound semiconductor layer structure 100 is connected to an additional separate electronic device structure 101 in vertical direction. Here, the vertical channel opening 13 can serve as a vertical via in order to galvanically connect the device structures 100, 101 arranged in the 3D semiconductor device 1000.

As shown, the additional separate electronic device structure 101 can be arranged opposite to the second main surface 12 of the substrate 10. Alternatively or additionally, the additional separate electronic device structure 101 or a further (not shown) additional separate electronic device structure can be arranged opposite to the first main surface 11 of the substrate 10.

In FIG. 4, the additional separate electronic device structure 101 arranged exemplarily opposite to the second main surface 12 of the substrate 10 can itself be an inventive vertical compound semiconductor structure 100 described herein. Alternatively, the additional separate electronic device structure 101 can be a 2D system produced in planar technology as shown in FIG. 4. The additional separate electronic device structure 101 can comprise, for example, an IC which again cooperates with circuit structures of the inventive vertical compound semiconductor structure 100 to form a 3D IC. Alternatively, the additional separate electronic device structure 101 can comprise a separate device, such as a chip forming a 3D package together with the inventive vertical compound semiconductor structure 100.

The inventive vertical compound semiconductor structure 100 and the additional separate electronic device structure 101 can be connected to one another galvanically and possibly also mechanically by means of a contacting portion 110. This connection can be realized, for example, by means of a so-called intermetallic compound (IMC) connecting method. The contacting portion 110 can comprise, for example, one or several metal pads 111a. The additional separate electronic device structure 101 can itself also comprise one or several metal pads 111b. Contact pads 112 can be arranged between the metal pads 111a, 111b to galvanically and/or mechanically connect the metal pads 111a, 111b to one another. The metal pads 111a, 111b can, for example, comprise copper and the contact pads 112 can comprise, for example, copper and/or tin.

As can be seen in FIG. 4, the additional separate electronic device structure 101 can comprise, for example, a substrate 113 having integrated metallization layers 114. The metallization layers 114 can be connected galvanically to the inventive vertical compound semiconductor structure 100 and in particular to the compound semiconductor layer 21 by means of the contacting portion 110.

In the embodiment shown in FIG. 4, the contacting portion 110 is arranged between the second main surface 12 of the substrate 10 and the additional separate electronic device structure 101. Alternatively or additionally, it is possible that the additional separate electronic device structure 101 or a further additional separate electronic device structure (not illustrated) is arranged opposite to the first main surface 11 of the substrate 10 by means of a suitable contacting portion 110. In that case, the inventive vertical compound semiconductor structure 100 would be arranged between two additional separate electronic device structures, such that a three-dimensional electronic semiconductor device 1000 (e.g., 3D IC or 3D package) is formed as a result.

Figure 5:
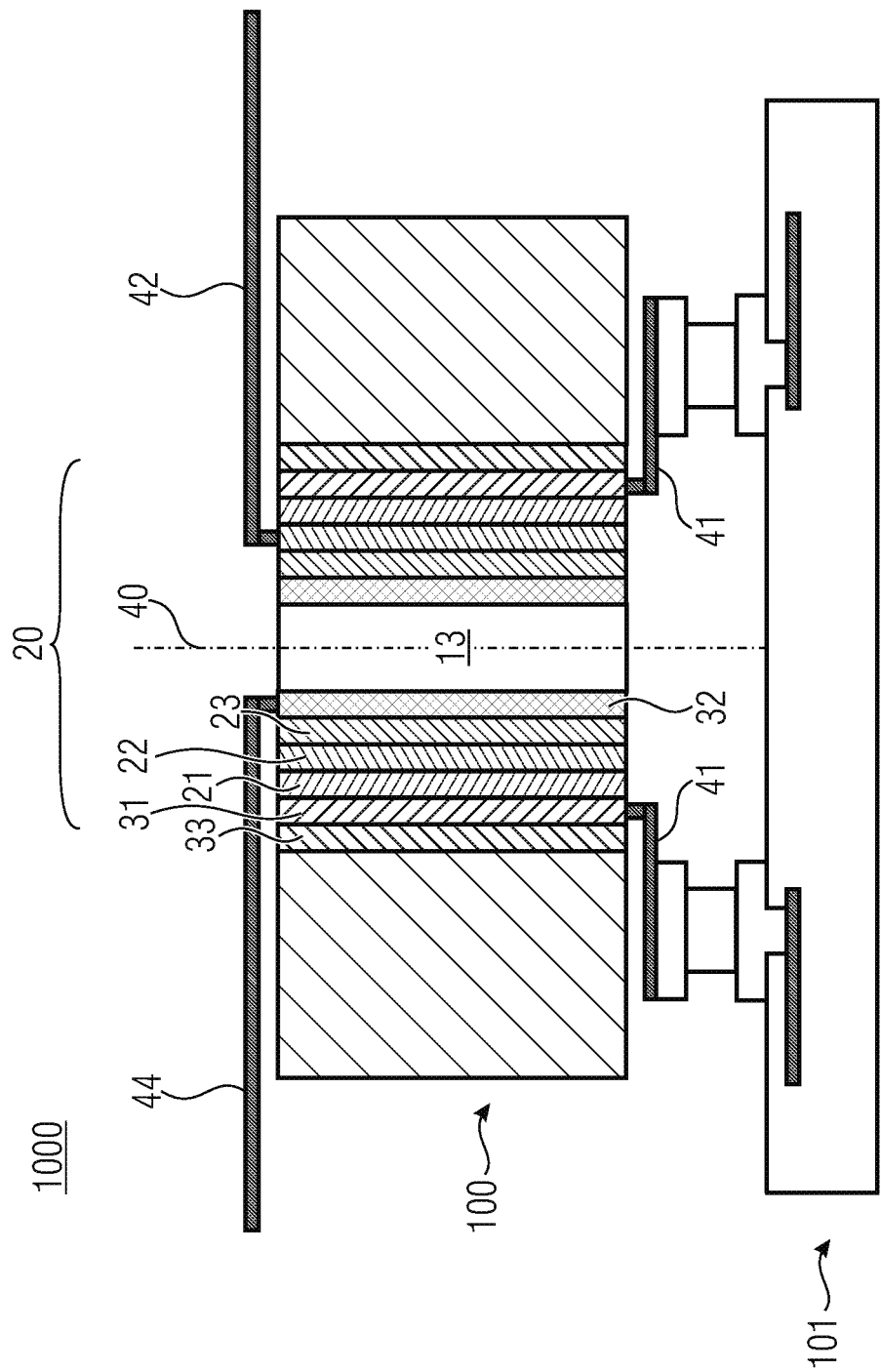
FIG. 5 is a schematic lateral sectional view of a vertical compound semiconductor structure with connection structure (wiring and control) to a separate electronic device structure for producing a three-dimensional electronic semiconductor element according to a further embodiment.

FIG. 5 shows a further embodiment of an inventive vertical compound semiconductor structure 100 as part of a three-dimensional electronic semiconductor device 1000. This embodiment corresponds essentially to the embodiment discussed above with reference to FIG. 4, which is why only the differences will be discussed below.

In the embodiment shown in FIG. 5, the layer stack 20 comprises a second electrically conductive layer 32. This second electrically conductive layer 32 is arranged within the vertical channel opening 13 and along the extension direction of the vertical channel opening 13. For this second electrically conductive layer 32, everything explained above with reference to the layers discussed in FIGS. 3A and 3B applies accordingly.

The second electrically conductive layer 32 can be arranged on the third compound semiconductor layer 23 and connected galvanically to the same. The second electrically conductive layer 32 can be arranged on the side of the third compound semiconductor layer 23 opposite to the second compound semiconductor layer 22 and can form the radial inner layer. This means the second electrically conductive layer 32 can form the innermost layer of the layer stack 20, i.e., the one closest to the center 40 of the channel opening 13 in radial direction. In this arrangement, accordingly, the second electrically conductive layer 32 can be arranged on the side of the third compound semiconductor layer 23 opposite to the second compound semiconductor layer 22, such that the third compound semiconductor layer 23 is arranged between the second compound semiconductor layer 22 and the second electrically conductive layer 32.

The second electrically conductive layer 32 allows full contacting of the third compound semiconductor layer 23. Therefore, the second electrically conductive layer 32 can also be referred to as connection layer for connecting the third compound semiconductor layer 23.

This means the first compound semiconductor layer 21 as well as the second compound semiconductor layer 22 would still be contacted directly, for example by means of electrical conductors 41, 42. The third compound semiconductor layer 23, however, would not be contacted directly. Instead, the second electrically conductive layer 32 can be contacted directly, for example by means of an electrical conductor 44, and the third compound semiconductor layer 23 can again be contacted indirectly via the second electrically conductive layer 32.

The above statements apply in the case of the transistor structure having three compound semiconductor layers 21, 22, 23 shown in FIG. 5. As long as the inventive compound semiconductor structure 100 is configured as a diode structure comprising two compound semiconductor layers 21, 22, all the above statements apply accordingly, wherein the second compound semiconductor layer 22 would replace the above-described third compound semiconductor layer 23. This means the second electrically conductive layer 32 could accordingly be arranged on the second compound semiconductor layer 22.

The second electrically conductive layer 32 can be arranged directly and immediately on the second compound semiconductor layer 22 and on the third compound semiconductor layer 23, respectively.

Although the above aspects have been described in the context of the inventive vertical compound semiconductor structure 100, it is obvious that these aspects also represent a description of the respective method for producing an inventive vertical compound semiconductor structure 100, such that a block or device of an apparatus can also be regarded as a respective method step or as a feature of a method step. Analogously, aspects described in the context of or as a method step also represent a description of a respective block or detail or feature of a respective apparatus.

In the following, the invention will be summarized again briefly in other words:

The present invention relates, among others, to a method for producing three-dimensional electronic systems 1000 and in particular three-dimensional integrated circuits. Three-dimensional integration means the vertical connection (mechanical and electrical) of devices. The advantages of a three-dimensional integrated electronic system 1000 are, among others, the higher packing densities and switching velocities (due to shorter conduction paths) that can be obtained compared to two-dimensional systems (planar technology).

The inventive method realizes the three-dimensional connection of vertical compound semiconductors 21, 22, 23 in substrate vias 13 of one substrate 10 with the devices 101 of another substrate and hence allows a significant integration density increase of three-dimensional integrated device systems 1000. With respect to the substrate 10, the substrate vias 13 can be electrically insulated vias (TSV-through substrate via).

The present invention relates, among others, to a method for producing three-dimensional electronic systems 1000, wherein, at first, a vertical channel opening 13 having an optional layer 33 that is electrically insulating with respect to the substrate 10 is generated in a substrate 10. Then, an electrically conductive layer 31 can be generated in the vertical side wall of the channel opening 13. This can be followed by generating a first semiconductor layer 22 that is connected to the electrically conductive layer 31 in an electrically conductive manner, as well as generating a second semiconductor layer 22 connected to the first semiconductor layer 21 in an electrically conductive manner and generating a third semiconductor layer 23 connected to the second semiconductor layer 22 in an electrically conductive manner, wherein at least one of the semiconductor layers 21, 22, 23 is configured as a compound semiconductor.

The electrically conductive and, without limiting the generality, mechanical connection to the bottom substrate/device 101 can be realized via the structure 110, and here, without limiting the generality, the same can be generated by means of intermetallic compound (IMC) connecting methods.

Thus, the inventive method realizes the three-dimensional connection of the vertical compound semiconductors 100 in the substrate vias 13 of one substrate 10 with the devices 101 of another substrate and hence allows highly dense integrated device systems 1000.

According to an aspect of the invention, a method for connecting at least two electrical components is suggested, comprising:
  providing a substrate 10,
  generating a vertical channel opening 13 through the substrate 10,
  generating a layer 33 on the vertical side wall of the vertical channel opening 13 that is electrically insulating with respect to the substrate 10,
  generating an electrically conductive layer 31 on the electrically insulating layer 33,
  generating a first semiconductor layer 21 connected to the electrically conductive layer 31 in an electrically conductive manner,
  generating a second semiconductor layer 22 connected to the first semiconductor layer 21 in an electrically conductive manner,
  generating a third semiconductor layer 23 connected to the second semiconductor layer 22 in an electrically conductive manner, and
  generating apparatuses 110 for connecting the layer stack 20 to at least one device structure 101 in an electrically conductive manner,
  wherein at least one of the semiconductor layers 21, 22 or 23 is configured as a compound semiconductor layer.

According to a further aspect, at least one of the compound semiconductor layers 21, 22, 23 is generated by deposition.

According to a further aspect, at least one of the compound semiconductor layers 21, 22, 23 is generated locally by chemical reaction.

According to a further aspect, additionally, an electrically conductive layer 32 is generated that is connected to the third semiconductor layer 23 in an electrically conductive manner.

Further, a vertical compound semiconductor structure 100 is suggested, in the following also referred to as microelectronic connection device, comprising:
  a substrate 10,
  a vertical channel opening 13 through the substrate 10,
  a layer 33 on the vertical side wall of the vertical channel opening 13 that is electrically insulating with respect to the substrate 10,
  an electrically conductive layer 31 on the electrically insulating layer 33,
  a first semiconductor layer 21 connected to the electrically conductive layer 31 in an electrically conductive manner,
  a second semiconductor layer 22 connected to the first semiconductor layer 21 in an electrically conductive manner,
  a third semiconductor layer 23 connected to the second semiconductor layer 22 in an electrically conductive manner,
  apparatuses 110 for connecting the layer stack 20 to at least one device structure 101 in an electrically conductive manner,
  wherein at least one of the semiconductor layers 21, 22, 23 is configured as a compound semiconductor layer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Method for producing a vertical semiconductor diode or transistor structure having at least one compound semiconductor, the method comprising:
 providing a substrate with a first main surface and an opposite second main surface, the substrate comprising at least one through-substrate-via being formed as a vertical channel opening extending completely through the substrate between the first main surface and the second main surface such that the substrate comprises an opening at the first main surface and an opening at the opposite second main surface,
 creating the vertical semiconductor diode or transistor device structure by generating a layer stack within the vertical channel opening, the layer stack comprising the shape of a hollow cylinder, and wherein the step of generating the layer stack comprises:
  arranging an electrically conductive layer within the vertical channel opening,
  arranging a dielectric layer between the electrically conductive layer and a wall of the vertical channel opening, wherein the dielectric layer is arranged directly on the wall, and wherein the electrically conductive layer is arranged directly on the dielectric layer,
  arranging a compound semiconductor layer within the vertical channel opening, such that the compound semiconductor layer is arranged directly on the electrically conductive layer and connected galvanically to the electrically conductive layer, and
  arranging a second compound semiconductor layer within the vertical channel opening, wherein the second compound semiconductor layer is arranged on the compound semiconductor layer and connected galvanically to the same,
  wherein the second compound semiconductor layer is arranged on a side of the compound semiconductor layer opposite to the electrically conductive layer, such that the compound semiconductor layer is arranged between the electrically conductive layer and the second compound semiconductor layer.

2. Method according to claim 1,
 wherein arranging the compound semiconductor layer comprises a monocrystalline compound semiconductor being arranged on the electrically conductive layer.

3. Method according to claim 1,
 wherein arranging the compound semiconductor layer comprises at least one 2D composite material being arranged on the electrically conductive layer.

4. Method according to claim 1,
 wherein the step of arranging the compound semiconductor layer comprises at least one element combination of the group of the transition metals and of the group of the chalcogenides being arranged on the electrically conductive layer.

5. Method according to claim 1,
 wherein the electrically conductive layer is arranged directly and immediately on the substrate within the vertical channel opening or
 wherein an isolator layer is arranged between the substrate and the electrically conductive layer within the vertical channel opening.

6. Method according to claim 1,
 wherein arranging the compound semiconductor layer comprises the compound semiconductor layer being deposited on the electrically conductive layer by applying a deposition method.

7. Method according to claim 1,
 wherein the compound semiconductor layer is formed of at least part of the electrically conductive layer by means of chemical conversion.

8. Method according to claim 1,
 wherein the second compound semiconductor layer comprises at least one 2D composite material.

9. Method according to claim 1,
 wherein the step of creating the vertical semiconductor diode or transistor structure by generating the layer stack further comprises:
 arranging a third compound semiconductor layer within the vertical channel opening, wherein the third compound semiconductor layer is arranged on the second compound semiconductor layer and connected galvanically to the same and
 wherein the third compound semiconductor layer is arranged on the side of the second compound semiconductor layer opposite to the first compound semiconductor layer, such that the second compound semiconductor layer is arranged between the compound semiconductor layer and the third compound semiconductor layer.

10. Method according to claim 9,
 wherein the third compound semiconductor layer comprises at least one 2D composite material.

11. Method according to claim 9,
 wherein creating the vertical semiconductor diode transistor structure by generating the layer stack further comprises:
 arranging a second electrically conductive layer within the vertical channel opening, wherein the second electrically conductive layer is arranged on the third compound semiconductor layer and connected galvanically to same and
 wherein the second electrically conductive layer is arranged on the side of the third compound semiconductor layer opposite to the second compound semiconductor layer, such that the third compound semiconductor layer is arranged between the second compound semiconductor layer and the second electrically conductive layer.

12. Method according to claim 1,
 wherein the substrate is connected galvanically and/or mechanically to an additional separate electronic device structure by means of a contacting portion arranged on its first main surface, wherein the additional separate electronic device structure is arranged opposite to the first main surface and/or
 wherein the substrate is connected galvanically and/or mechanically to the additional separate electronic device structure or to a further additional separate electronic device structure by means of a contacting portion arranged on a second main surface, wherein the same is arranged opposite to the second main surface, to generate a three-dimensional electronic semiconductor device.

13. The method according to claim 1,
wherein the layer stack arranged within the vertical channel opening extends completely between the first main surface of the substrate and the second main surface of the substrate in vertical direction.

\* \* \* \* \*